(12) United States Patent
Sung et al.

(10) Patent No.: US 6,483,886 B1
(45) Date of Patent: Nov. 19, 2002

(54) PHASE-LOCKED LOOP CIRCUITRY FOR PROGRAMMABLE LOGIC DEVICES

(75) Inventors: Chiakang Sung, Milpitas, CA (US); Joseph Huang, San Jose, CA (US); Bonnie I. Wang, Cupertino, CA (US); Richard G. Cliff, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/366,940

(22) Filed: Aug. 4, 1999

Related U.S. Application Data

(60) Provisional application No. 60/115,238, filed on Jan. 8, 1999.

(51) Int. Cl.$^7$ ................................................ H03L 7/06
(52) U.S. Cl. ........................ 375/376; 375/374; 375/375; 327/157
(58) Field of Search ................................ 375/371, 373, 375/374, 375, 376, 294; 331/25, 34, 57, 48, 16, 18; 327/146, 147, 148, 149, 155, 156, 157, 158, 160

(56) References Cited

U.S. PATENT DOCUMENTS

| | | | |
|---|---|---|---|
| 4,494,021 A | * | 1/1985 | Bell et al. .................... 327/259 |
| 4,633,488 A | | 12/1986 | Shaw .......................... 375/120 |

(List continued on next page.)

FOREIGN PATENT DOCUMENTS

| | | |
|---|---|---|
| EP | 0 266 065 | 9/1987 |
| JP | 1-137646 | 5/1989 |

OTHER PUBLICATIONS

Advanced Micro Devices, Inc., "Am2971 Programmable Event Generator (PEG)," Publication No. 05280, Rev. C, Amendment /0, pp. 4–286—4–303 (Jul. 1986).

Advanced Micro Devices, Inc., "AmPAL*22S8 20–Pin IMOX PAL–Based Sequencer," Publication No. 06207, Rev. B, Amendment /0, pp. 4–102—4–121 (Oct. 1986).

DynaChip Corp., "Application Note: Using Phase Locked Loops in DL6035 Devices" (1998).

DynaChip Corp., DY6000 Family Datasheet (Dec. 1998).

Ko, U., et al., "A 30–ps Jitter, 3.6 $\mu$s Locking, 3.3–Volt Digital PLL for CMOS Gate Arrays," *Proceedings of the IEEE 1993 Custom Integrated Circuits Conference*, Publication No. 0–7803–0826–3/93, pp. 23.3.1–23.3.4 (May 9–12, 1993).

LSI Logic Corp., 500K Technology Design Manual (Document DB04–000062–00, First Edition), pp. 8–1—8–33 (Dec. 1996).

Lucent Technologies, Inc., Optimized Reconfigurable Cell Array (ORCA®) OR3Cxxx/OR3Txx Series Field–Programmable Gate Arrays, Preliminary Product Brief, (Nov. 1997).

(List continued on next page.)

*Primary Examiner*—Chi Pham
*Assistant Examiner*—Khanh Cong Tran
(74) *Attorney, Agent, or Firm*—Fish & Neave; Jeffrey H. Ingerman

(57) ABSTRACT

A phase-locked loop circuit ("PLL") is adjustable in both phase and frequency. By providing a plurality of taps on the voltage-controlled oscillator of the PLL, and providing separate multiplexers, each of which can select a different tap—one for the PLL feedback loop and one for the PLL output—one allows the user to adjust the phase of the output relative to that of the input. Similarly, by providing loadable pre-scale (divide by N), post-scale (divide by K) and feedback-scale (divide by M) counters, one allows the user to adjust the frequency of the output to be M/(NK) times that of the input.

39 Claims, 4 Drawing Sheets

U.S. PATENT DOCUMENTS

| | | | |
|---|---|---|---|
| 4,719,593 A | | 1/1988 | Threewitt et al. ............ 364/900 |
| 4,857,866 A | * | 8/1989 | Tateishi ...................... 331/1 A |
| 4,868,522 A | | 9/1989 | Popat et al. .................... 331/2 |
| 4,959,646 A | | 9/1990 | Podkowa et al. ....... 340/825.83 |
| 5,072,195 A | | 12/1991 | Graham et al. ................. 331/2 |
| 5,075,575 A | | 12/1991 | Shizukuishi et al. ......... 307/465 |
| 5,079,519 A | | 1/1992 | Ashby et al. ............... 331/1 A |
| 5,133,064 A | | 7/1992 | Hotta et al. .................. 395/550 |
| 5,204,555 A | | 4/1993 | Graham et al. ............. 307/465 |
| 5,349,544 A | | 9/1994 | Wright et al. ............... 364/600 |
| 5,397,943 A | | 3/1995 | West et al. .................... 326/39 |
| 5,418,499 A | | 5/1995 | Nakao .......................... 331/57 |
| 5,420,544 A | | 5/1995 | Ishibashi ...................... 331/11 |
| 5,506,878 A | | 4/1996 | Chiang ......................... 377/39 |
| 5,581,214 A | * | 12/1996 | Iga .............................. 327/107 |
| 5,642,082 A | | 6/1997 | Jefferson ...................... 331/25 |
| 5,646,564 A | | 7/1997 | Erickson et al. ............ 327/158 |
| 5,699,020 A | | 12/1997 | Jefferson ...................... 331/17 |
| 5,742,180 A | | 4/1998 | DeHon et al. ................. 326/40 |
| 5,744,991 A | | 4/1998 | Jefferson et al. ............ 327/158 |
| RE35,797 E | | 5/1998 | Graham et al. ................ 326/40 |
| 5,777,360 A | | 7/1998 | Rostoker et al. ............ 257/315 |
| 5,815,016 A | | 9/1998 | Erickson .................... 327/158 |
| 5,847,617 A | | 12/1998 | Reddy et al. ................. 331/57 |
| 5,963,069 A | | 10/1999 | Jefferson et al. ............ 327/158 |
| 6,114,915 A | * | 9/2000 | Huang et al. ............... 331/1 A |
| 6,141,394 A | * | 10/2000 | Linebarger et al. ......... 327/157 |
| 6,278,332 B1 | * | 8/2001 | Nelson et al. .............. 327/108 |
| 6,320,469 B1 | * | 11/2001 | Friedberg et al. ........... 327/156 |

OTHER PUBLICATIONS

Lucent Technologies, Inc., ORCA® Series 3 Field–Programmable Gate Arrays, Preliminary Data Sheet, Rev. 01 (Aug. 1998).

Monolithic Memories, Inc., "Programmable Array Logic PAL20RA10–20 Advance Information" pp. 5–95—5–102 (Jan. 1988).

National Semiconductor Corp., "DS90CR285/DS90CR286 +3.3V Rising Edge Data Strobe LVDS 28–Bit Channel Link–66 MHZ," (Mar. 1998).

Xilinx, Inc., Virtex 2.5V Field Programmable Gate Arrays Advance Product Specification (Version 1.0) (Oct. 20, 1998).

Xilinx, Inc., Application Note: Using the Virtex Delay–Locked Loop (Version 1.31) (Oct. 21, 1998).

Zaks, R., et al., *From Chips to Systems: An Introduction to Microcomputers*, pp. 54–61 (Prentice–Hall, Inc., Englewood Cliffs, N.J., 1987).

* cited by examiner

PHASE-LOCKED LOOP CIRCUITRY FOR PROGRAMMABLE LOGIC DEVICES

CROSS REFERENCE TO RELATED APPLICATION

This claims the benefit of copending, commonly-assigned U.S. Provisional Patent Application No. 60/115,238, filed Jan. 8, 1999.

BACKGROUND OF THE INVENTION

This invention relates to phase-locked loop circuitry for programmable logic devices. More particularly, this invention relates to a phase-locked loop circuit for a programmable logic device having greater flexibility in adjusting both frequency and phase of the output signal relative to those of the input signal.

Programmable logic devices are well known. Commonly, a programmable logic device has a plurality of substantially identical logic elements, each of which can be programmed to perform certain desired logic functions. The logic elements have access to a programmable interconnect structure that allows a user to interconnect the various logic elements in almost any desired configuration. Finally, the interconnect structure also provides access to a plurality of input/output ("I/O") pins, with the connections of the pins to the interconnect structure also being programmable.

At one time, programmable logic devices of the type just described were implemented almost exclusively using transistor-transistor logic ("TTL"), in which a logical "high" signal was nominally at 5 volts, while a logical "low" signal was nominally at ground potential, or 0 volts. More recently, however, other logic standards have come into general use, some of which use different signalling schemes, such as LVTTL (Low Voltage TTL), PCI (Peripheral Component Interface), SSTL (Series Stub Terminated Logic, which has several variants), GTL (Gunning Transceiver Logic) or GTL+, HSTL (High Speed Transceiver Logic, which has several variants), LVDS (Low Voltage Differential Signalling), and others. Some of these signalling schemes, and particularly LVDS, require high-frequency clock signals with precise phase relationships for proper operation.

It is known to include phase-locked loop circuitry on programmable logic devices to help counteract "skew" and excessive delay in clock signals propagating on the device (see, for example, Jefferson U.S. Pat. No. 5,699,020 and Reddy et al. U.S. Pat. No. 5,847,617, both of which are hereby incorporated by reference herein in their entireties). For example, phase-locked loop circuitry may be used to produce a clock signal which is advanced in time relative to a clock signal applied to the programmable logic device. The advanced clock signal is propagated to portions of the device that are relatively distant from the applied clock signal so that the propagation delay of the advanced clock signal brings it back into synchronism with the applied clock signal when it reaches the distant portions of the device. In this way all portions of the device receive synchronous clock signals and clock signal "skew" (different amounts of delay in different portions of the device) is reduced.

However, while phase-locked loops are accurate sources of clock signals, they generally are limited in the frequencies they can provide, both in terms of adjustability, and in terms of the absolute range of frequencies that can be generated. Moreover, the ability to adjust the phase of the output clock signal relative to the input clock signal is limited.

It would be desirable to be able to provide a phase-locked loop circuit that is adjustable in phase and can generate a wide range of frequencies.

It would be particularly desirable to be able to provide such a phase-locked loop circuit on a programmable logic device, especially to provide a clock signal for a high-speed signalling scheme, such as LVDS.

SUMMARY OF THE INVENTION

It is an object of this invention to attempt to provide a phase-locked loop circuit that is adjustable and can generate a wide range of frequencies.

It is a particular object of this invention to attempt to provide such a phase-locked loop circuit on a programmable logic device, especially to provide a clock signal for a high-speed signalling scheme, such as LVDS.

In accordance with the present invention, there is provided a phase-locked loop circuit having an input terminal for accepting an input clock signal, a phase/frequency detector having a signal input connected to the input terminal, a phase/frequency detection input and a signal output, a charge pump having a pump input connected to the signal output of the phase/frequency detector and having a pump output, and a voltage-controlled oscillator having an oscillator input connected to the pump output, an oscillator output, and a plurality of signal taps. The signal taps are separated from one another in phase by substantially uniform delays. A feedback loop feeds back to the phase detection input a signal from one of the signal taps. The feedback loop has a feedback multiplexer for selecting that one of the signal taps to feed back. An output multiplexer selects one of the signal taps as an output signal of the phase-locked loop. When the output multiplexer selects a first signal tap and the feedback multiplexer selects a subsequent one of the signal taps separated from the first signal tap by an odd number of signal taps, the output signal has a phase that is advanced relative to the input clock signal by an even multiple (specifically, one more than the odd number of signal taps) of the substantially uniform delay. When the feedback multiplexer selects a first signal tap and the output multiplexer selects a subsequent one of the signal taps separated from the first signal tap by an odd number of signal taps, the output signal has a phase that is retarded relative to the input clock signal by an even multiple (specifically, one more than the odd number of signal taps) of the substantially uniform delay.

In addition, either with or without the feedback and output multiplexers, the phase-locked loop includes a programmable pre-scale counter at the input terminal, a programmable post-scale counter downstream of the output multiplexer and a programmable feedback-scale counter downstream of the feedback multiplexer in the feedback loop. Each of the counters is loadable or programmable with an integer value. The pre-scale counter divides the frequency of the output signal by the integer value programmed therein, the post-scale counter divides the frequency of the output signal by the integer value programmed therein, and the feedback-scale counter multiplies the frequency of the output signal by the integer value programmed therein.

Such a phase-locked loop circuit can be adjusted to provide almost any rational multiple of the input frequency by correctly choosing the integers loaded into the various counters. If the feedback-scale counter is loaded with integer M, the pre-scale counter is loaded with integer N and the post-scale counter is loaded with integer K, then the output frequency equals the input frequency multiplied by M/(NK). Thus, the phase-locked loop circuit can be used as a general purpose frequency synthesizer.

The voltage-controlled oscillator preferably is a ring oscillator having an odd number of stages each of which is essentially an inverter. The phase delay that is characteristic of the operation of a phase-locked loop derives from the cumulative delays of the inverters. Therefore, the relative phase of the output signal can be adjusted by tapping the voltage-controlled oscillator for feedback and output signals at the correct stages.

Thus, if the two signals are tapped from two stages having one stage between them, the output signal will differ in phase from the input signal by the phase delay of two stages. This is the minimum possible phase shift unit, because while the outputs of two adjacent taps differ by the delay of one stage, they are also inverted relative to one another, adding 180° to the phase shift between them. For example, if the output of one stage is a rising edge, the output of the next stage, though delayed by only one additional delay, would be a falling edge.

Whether the output signal leads or lags the input signal in phase is determined by whether the feedback signal is tapped upstream or downstream of where the output signal is tapped. When the output signal is tapped from a first signal tap and the feedback signal is tapped from a subsequent tap, the output signal has a phase that is advanced relative to the input clock signal. When the feedback signal is tapped from a first signal tap and the output signal is tapped from a subsequent tap, the output signal has a phase that is retarded relative to the input clock signal. However, it will be recognized that whether one signal leads another by a particular phase angle, or lags the other by 360° minus that phase angle, is relative, and might have to be determined based on other signals.

In addition, the phase-locked loop circuit preferably has an alternate output that bypasses the post-scale counter. Therefore, the circuit actually has two outputs, both having the same phase, but one having a frequency K times the other.

One limitation on the phase-locked loop circuit as a general frequency synthesizer is that even though the ratio M/(NK) may be a small number, any individual one of the factors M, N and K may be large, meaning that in a particular portion of the circuit, the frequency may be very high or very low. Care must be taken not to choose M, N or K so large that the intermediate frequencies are too high or low for the circuit components to handle.

For example, assume that it is desired to use the phase-locked loop circuit to convert signals from the conventional "T1" telecommunications data rate to the conventional "E1" telecommunications data rate. T1 operates at 1.544 MHZ; E1 operates at 2.048 MHZ. To produce an E1 clock signal from a T1 clock signal requires the T1 clock signal frequency to be multiplied by approximately 1.326, or more specifically by the rational number 256/193. This can implemented, using the counters, as a multiplication by 256, followed by a division by 193, or alternatively as a division by 193 followed by a multiplication by 256. The first approach is to use the "divide by N" pre-scale counter to divide the incoming T1 clock signal frequency by 193. Then the "divide by M" feedback-scale counter is used to force the phase/frequency detector and voltage-controlled oscillator to multiply the signal frequency from the pre-scale counter by 256. The "divide by K" post-scale counter is bypassed (or loaded with the value "1"). A possible problem with this approach is that the phase/frequency detector is receiving an 8 kHz signal from the pre-scale counter (because 1.544 MHZ÷193=8 kHz). 8 kHz is a relatively low frequency that may be below the minimum acceptable input frequency for the phase/frequency detector. Care must be taken to build the phase-locked loop circuit with components that will function at frequencies that low or lower if they are expected.

The second approach is to bypass the "divide by N" pre-scale counter (or load it with the value "1") and use the "divide by M" feedback-scale counter to force the phase/frequency detector and voltage-controlled oscillator to multiply the incoming T1 clock signal frequency by 256. This produces a voltage-controlled oscillator output signal having a frequency of approximately 395 MHZ. The "divide by K" post-scale counter is then used to divide the voltage-controlled oscillator output signal frequency by 193. A possible problem with this approach is that 395 MHZ is a relatively high frequency. Care must be taken to build the phase-locked loop circuit with components that will function at frequencies that high or higher if they are expected.

A further advantage of having both the "divide by N" pre-scale counter and the "divide by K" post-scale counter is the ability to perform some of the division as a pre-scale operation and some of the division as a post-scale operation. That could be advantageous in a situation where the factor by which the frequency is to be divided is so high that performing the division at the input would mean that the input frequency to the phase/frequency detector from the "divide by N" pre-scale counter would be too low as described above, but leaving the division for the "divide by K" post-scale counter would mean that the input frequency to the phase/frequency detector from the "divide by M" feedback-scale counter would be too high as discussed above. Breaking the division operation down into pre-scale and post-scale operations can be done as long as the factor by which the frequency is to be divided ("frequency divisor") is not a prime number, so that there are two non-unity integer factors to be loaded into the pre-scale and post-scale counters. (In the example set forth above, the frequency divisor is a prime number, so this alternative would not be available.)

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
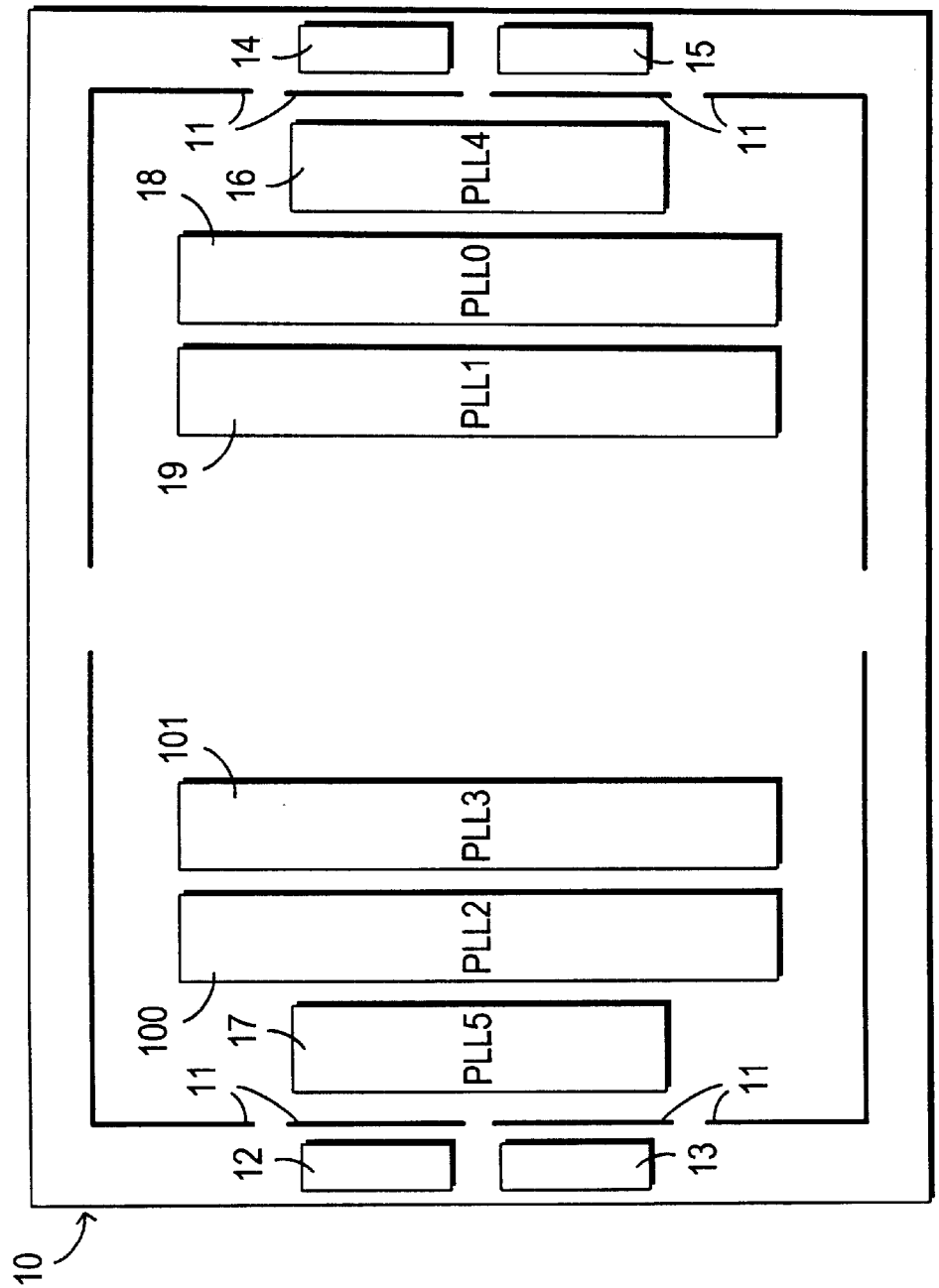
FIG. 1 is a schematic diagram of a preferred embodiment of a programmable logic device incorporating the phase-locked loop circuitry of this invention.

FIG. 1 shows a schematic overview of a programmable logic device 10 incorporating a preferred embodiment of the invention. Device 10 includes power bus segments 11, which allow the provision of different supply voltages to different groups of input/output interfaces in different parts of device 10, as explained in more detail in copending, commonly-assigned U.S. Patent Applications No. 60/115, 216, filed Jan. 8, 1999, and Ser. No. 09/366,938, filed concurrently herewith, which are hereby incorporated by reference in their entireties. As explained in more detail in those incorporated applications, interfaces 12, 13 support LVDS (low voltage differential signalling) inputs, while interfaces 14, 15 support LVDS outputs. Other interfaces (not shown) may support other signalling schemes.

As can be seen in FIG. 1, device 10 preferably includes a plurality of phase-locked loop ("PLL") circuits. Phase-locked loop circuits 16, 17 (identified as PLL4 and PLL5) are specialized PLL circuits as described in copending, commonly-assigned U.S. Applications No. 60/115,215, filed Jan. 8, 1999 and Ser. No. 09/368,464, filed concurrently herewith, now U.S. Pat. No. 6,252,419, designed for use in high-speed LVDS applications.

PLL circuits 18, 19, 100, 101 (identified as PLL0 PLL1, PLL2, PLL3) are provided for lower-speed LVDS applications, as well as for general use by device 10. PLL circuits 18, 19, 100, 101 preferably can provide frequencies between about 1 MHZ and about 400 MHZ, based on LVDS input clocks at pins 20 and 21, 22 and 23, 24 and 25, and 26 and 27, respectively. As described in more detail in above-incorporated Application No. 60/115,215 and Ser. No. 09/368,464, pins 20, 22, 24, 26 can also receive standard input clocks, and all clock inputs can bypass their respective PLLs at 28, 29, 200, 201.

Figure 2:
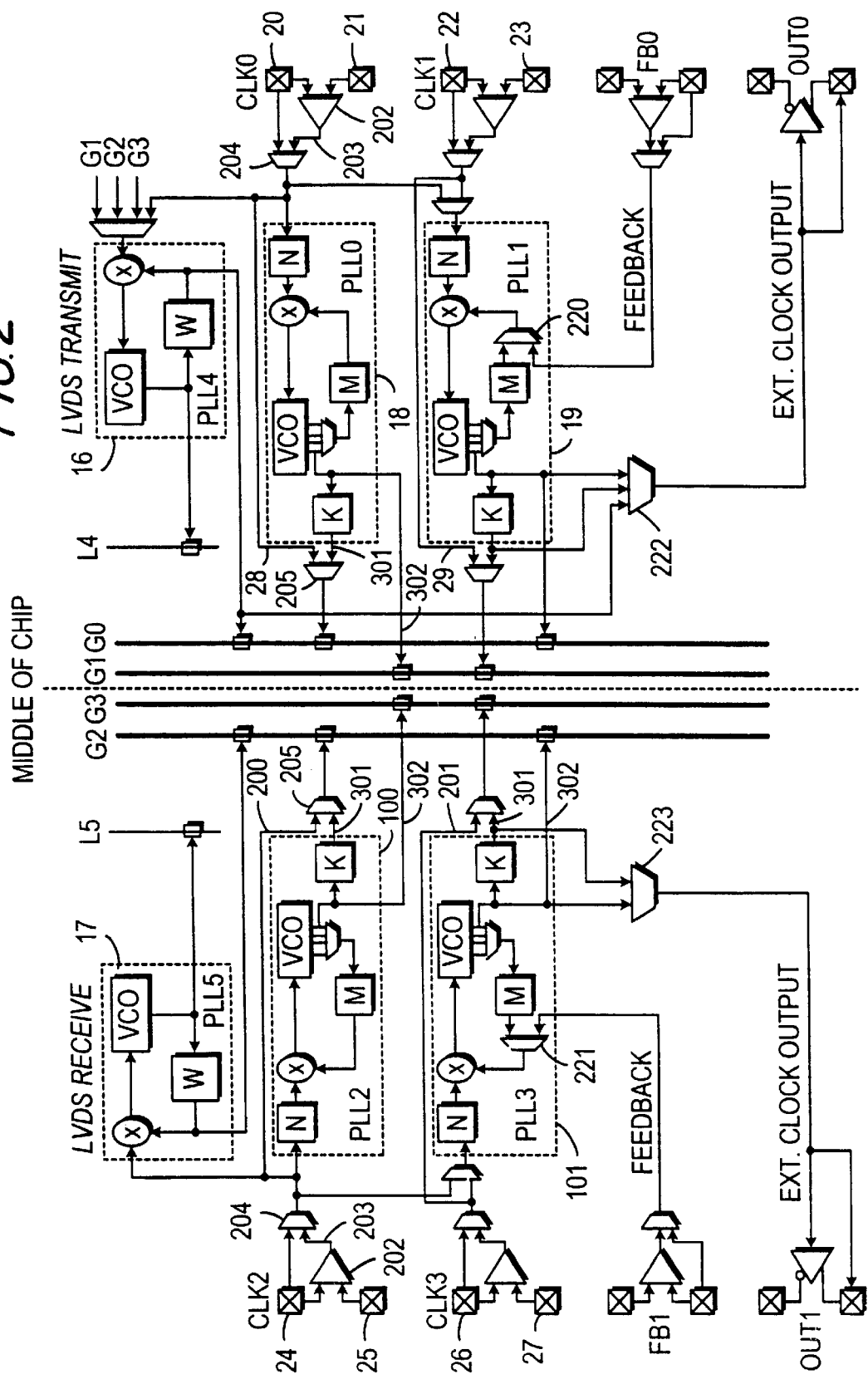
FIG. 2 is a more detailed schematic diagram of the programmable logic device of FIG. 1 showing the phase-locked loop circuitry.
Figure 3:
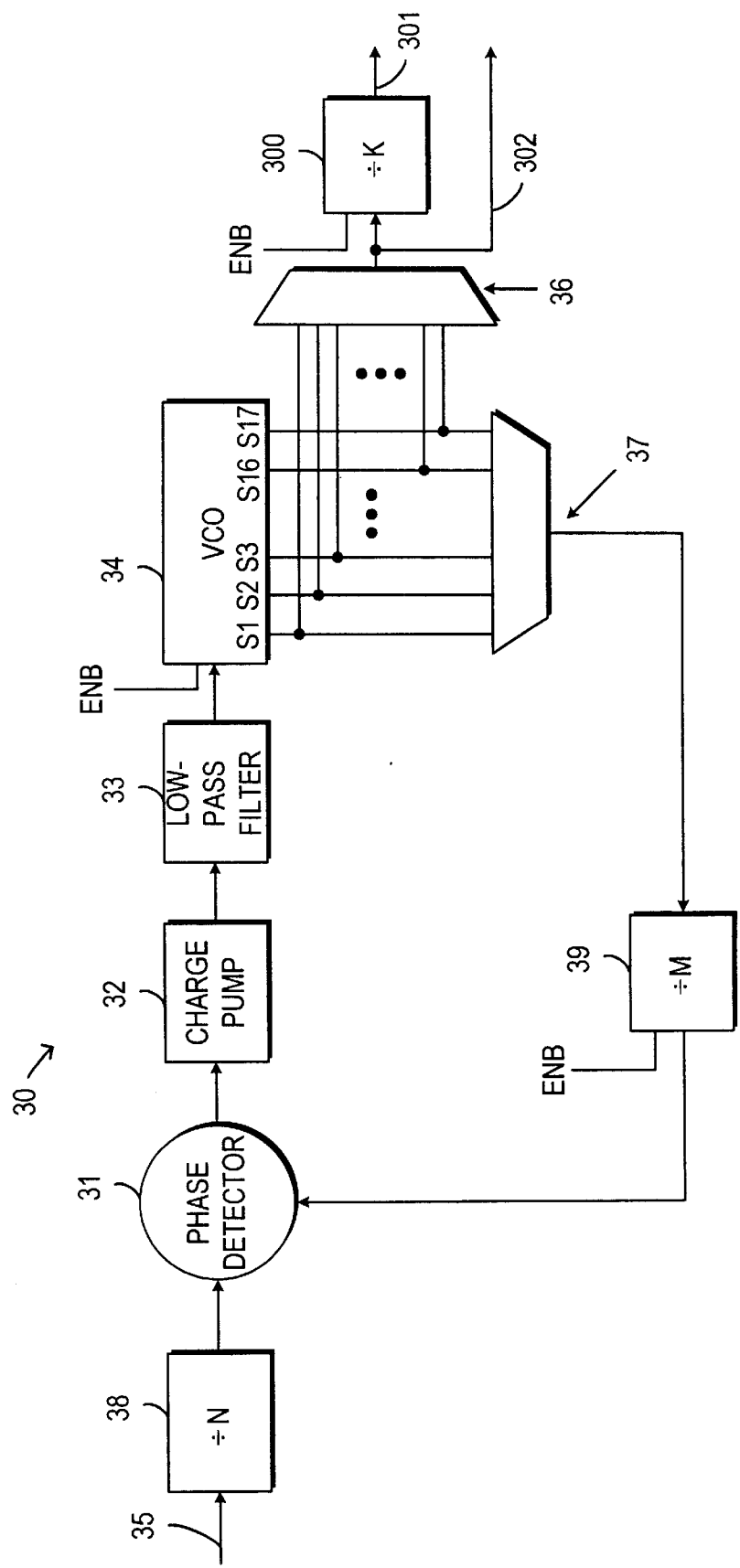
FIG. 3 is a schematic diagram of a preferred embodiment the phase-locked loop circuitry of this invention.

PLLs 18 and 100 are shown in schematic form in FIG. 2, but are shown in more detail in FIG. 3 as PLL circuit 30. PLL circuit 30 includes all of the conventional PLL circuit elements, including a phase/frequency detector 31, a charge pump 32, a low-pass filter 33 and a voltage-controlled oscillator 34 whose output in a traditional PLL is the PLL output and also is fed back to phase/frequency detector 31.

In known PLL operation, phase/frequency detector 31 receives the input clock signal from input terminal 35, and the feedback clock signal from VCO 34, and produces "up" or "down" output signal pulses applied to charge pump 32 depending on whether the phase of the input clock signal leads or lags the phase of the feedback clock signal. The width of the "up" or "down" signal pulses is typically controlled by phase/frequency detector 31 to be proportional to the phase difference between the input and feedback clock signals. Charge pump 32 provides a transfer function of the "up" and "down" signals to an output signal voltage at a level between VCC (the power supply voltage of device 10) and ground. The "up" and "down" signals switch an internal current source to deliver a charge to move the charge pump output signal voltage up or down during each clock cycle.

The output signal of charge pump 32 is applied to low-pass filter 33, which smooths the signal for application as a control signal to the associated voltage-controlled oscillator ("VCO") 34. In sum, when the phase of the input clock signal leads the phase of the feedback clock signal, an "up" signal is generated by phase/frequency detector 31. This results in an increase in the frequency of the feedback clock signal. Conversely, when the phase of the input clock signal lags the phase of the feedback clock signal, phase/frequency detector 31 produces a "down" signal, which causes a decrease in the frequency of the feedback clock signal.

In PLL circuit 30, VCO 34 preferably has seventeen taps, $s_1, \ldots, s_{17}$, any one of which can be used as the output of PLL 30 or the feedback to phase/frequency detector 31. The signal taps preferably are separated from one another in phase by a substantially uniform delay. Commonly, the VCO is implemented as a ring oscillator including an odd number of inverters (not shown) arranged in series, with the output of the last inverter connected to the input of the first inverter. It will be understood that any odd number of inverters can be used, providing a corresponding number of taps. In this embodiment, VCO 34 preferably has seventeen inverters and seventeen taps, in which, because of the nature of ring oscillators, each inverter provides a phase delay of 360°/(17×2). The minimum phase separation that can be obtained from VCO 34 is that between two taps separated by another tap, and is defined by the summed delay of two individual inverters, which is equal to 360°/17≈21°. Each of the seventeen taps preferably feeds an output multiplexer 36 as well as feedback multiplexer 37, so that any one tap can be selected for output and any one tap can be selected for feedback.

Standard PLL functionality is achieved by tapping tap $s_{17}$ for both feedback and output purposes. However, in accordance with the present invention, any one of taps $s_1, \ldots s_{17}$ can be selected as the output and any one of taps $s_1, \ldots s_{17}$ can be selected for feeding back to phase/frequency detector 31. When the tap selected for the output is a lower-numbered tap than the tap selected for feedback, the output phase is ahead of the input phase by one more inverter delay unit than the number of taps between the selected taps. Thus, tapping two taps with one tap in between provides one minimum phase shift unit which is equal to two inverter delay units; tapping two taps separated by three taps provides four inverter delay units, or two minimum phase shift units; etc. Similarly, when the tap selected for feedback is a lower-numbered tap than the tap selected for the output, the output phase is behind the input phase by one more inverter delay unit than the number of taps between the selected taps. As a practical matter, for maximum phase adjustability, $s_1$ preferably is always one of the selected taps.

As discussed above, PLL circuit 30 preferably also includes the three programmable scaling counters 38, 39, 300. Pre-scale counter 38 preferably is programmable, or loadable, with an integer N by which the frequency of any input signal, and ultimately any output signal, is divided. Feedback-scale counter 39 preferably is loadable with an integer M by which the frequency of the feedback signal from multiplexer 37 to phase/frequency detector 31 is divided, resulting in multiplication of the output signal by M. Post-scale counter 300 preferably is loadable with an integer K by which the frequency of the output signal is divided.

Thus, at output 301, an output signal is provided whose frequency is equal to the frequency of the input signal at 35 multiplied by M/(NK). In addition, at alternate output 302, which bypasses post-scale counter 300, an output signal is provided whose frequency is equal to the frequency of the input signal at 35 multiplied by M/N. Although the effect of providing bypass output 302 is the same as setting K=1 (indeed, counters 38, 39 can also be "bypassed" by setting N=1 or M=1), output 302 allows the option of having outputs of two different frequencies. Either output 301, 302 has the same phase relationship to the input signal, which is determined by which taps of VCO 34 are tapped by multiplexers 36, 37, as discussed above.

As stated above, PLL circuit 30 is used in device 10 as PLL0 18 and PLL2 100. Although in FIG. 2, PLL0 18 and PLL2 100 are shown without multiplexer 36 and with only a single output line from the VCO, and also without charge pump 32 or low-pass filter 33, that is merely a schematic representation, and those components, shown in FIG. 3, should be considered to be present in FIG. 2 as well.

LVDS output clock CLK0 is received at pins 20 and 21, fed through differential amplifier 202 to produce a clock signal at 203 that is selected by multiplexer 204 for input to PLL0 18, which feeds multiplexer 205. Clock signal 203 is also fed directly to multiplexer 205 by bypass 28. Thus, as determined by the programming of multiplexer 205, clock signal 203 can be fed directly to chip-wide clock conductor G0, or it can be modified first by PLL0 18 (i.e., its frequency and/or phase can be altered as described above in connection with FIG. 3) and then to fed to conductor G0, while the bypass output 302 is fed to chip-wide clock conductor G1. Pin 20 can also be used for a non-LVDS, single-input clock signal, in which case pin 20 is selected directly by multiplexer 204, and passed directly to conductor G0.

Similarly, the LVDS input clock CLK2 at pins 24, 25 can be fed through differential amplifier 212 to produce a clock signal at 213 that is selected by multiplexer 214 for input to PLL2 100, which feeds multiplexer 215. Clock signal 213 is also fed directly to multiplexer 215 by bypass 200. Thus, as determined by the programming of multiplexer 215, clock signal 213 can be fed directly to chip-wide clock lead G2, or it can be modified first by PLL2 100 (i.e., its frequency and/or phase can be altered as described in connection with FIG. 3) and then fed to conductor G2, while the bypass output 301 is fed to chip-wide clock conductor G3. Pin 24 can also be used for a non-LVDS, single-input clock signal, in which case pin 24 is selected directly by multiplexer 214 and passed directly to conductor G2.

PLL1 19 and PLL3 101 are similar to PLL0 18 and PLL2 100, and operate as described in connection with FIG. 3, except that multiplexers 220, 221 are provided to allow user-modified feedback FB0 or FB1, respectively, in place of the feedback from the VCO. In addition, multiplexers 222, 223 allow the post-scaled output 301 or the bypass output 302 to be provided as an external clock output OUT0 or OUT1. As described in more detail in above-incorporated application Ser. No. 09/368,464, output clocks OUT0 and OUT1 can be manipulated by the user and fed back in at FB0 or FB1 to provide the modified feedback for PLL1 19 or PLL3 101.

Figure 4:
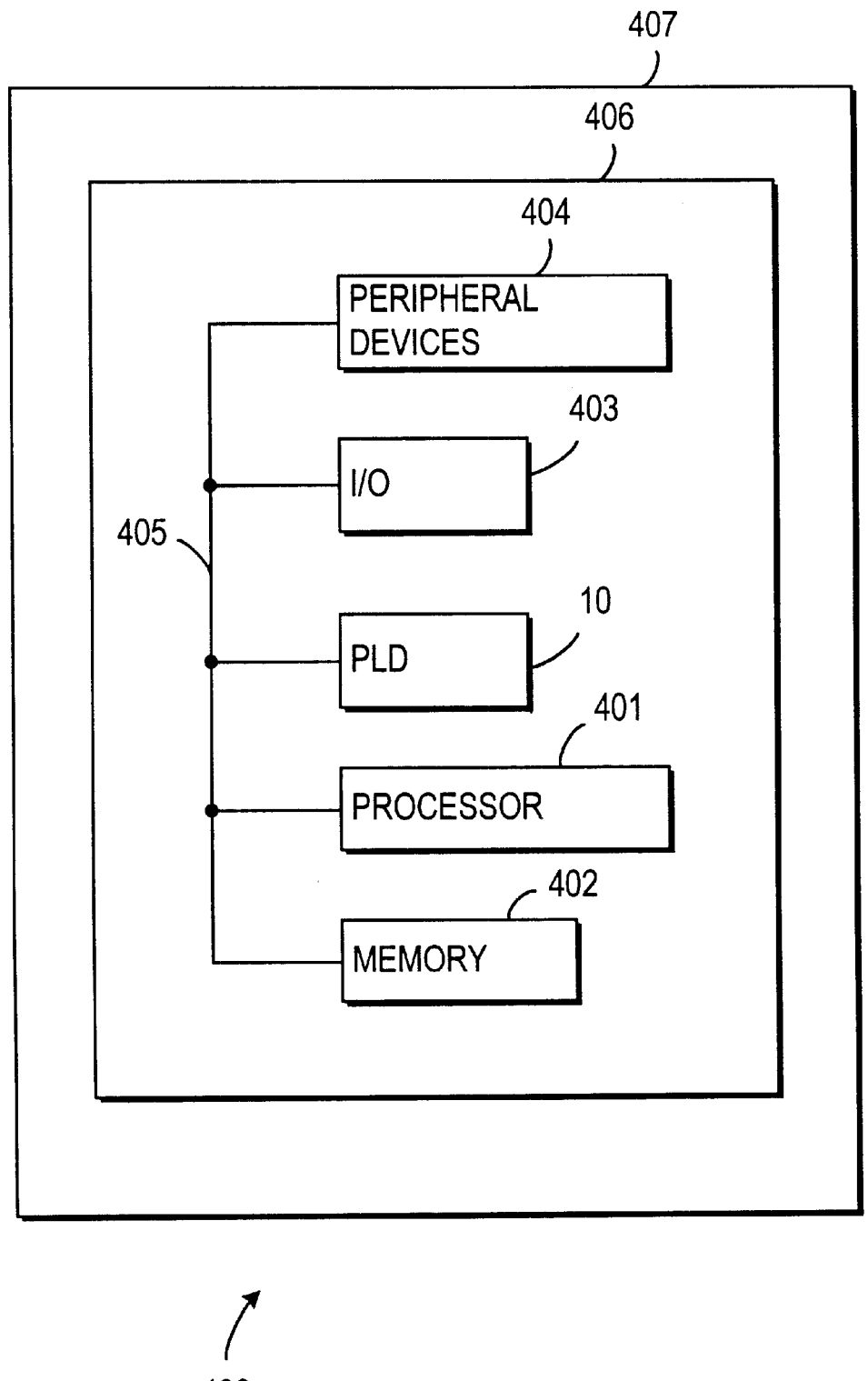
FIG. 4 is a simplified block diagram of an illustrative system employing a programmable logic device incorporating phase-locked loop circuitry according to the present invention.

FIG. 4 illustrates a programmable logic device 10 incorporating programmable I/O circuits 20 or 40 configured according to this invention in a data processing system 400. Data processing system 400 may include one or more of the following components: a processor 401; memory 402; I/O circuitry 403; and peripheral devices 404. These components are coupled together by a system bus 405 and are populated on a circuit board 406 which is contained in an end-user system 407.

System 400 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 401. Programmable logic device 10 may also be used as an arbiter for arbitrating access to a shared resource in system 400. In yet another example, programmable logic device 10 can be configured as an interface between processor 401 and one of the other components in system 400. It should be noted that system 400 is only exemplary, and that the true scope and spirit of the invention should be indicated by the following claims.

Various technologies can be used to implement programmable logic devices 10 employing PLL circuits 18, 19, 100, 101 according to this invention, as well as the various components of the PLL circuits. Moreover, this invention is applicable to both one-time-only programmable and reprogrammable devices.

Thus it is seen that a phase-locked loop circuit that is adjustable in phase and can generate a wide range of frequencies, and which can be included on a programmable logic device, especially to provide a clock signal for a high-speed signalling scheme, such as LVDS, has been provided. One skilled in the art will appreciate that the present invention can be practiced by other than the described embodiments, which are presented for purposes of illustration and not of limitation, and the present invention is limited only by the claims which follow.

What is claimed is:

1. A phase-locked loop circuit comprising:

an input terminal for accepting an input clock signal;

a phase/frequency detector having a signal input connected to said input terminal, a phase detection input and a signal output;

a charge pump having a pump input connected to said signal output of said phase/frequency detector and having a pump output;

a low-pass filter having a filter input connected to said pump output and having a filter output;

a voltage-controlled oscillator having an oscillator input connected to said filter output, an oscillator output, and a plurality of signal taps, said signal taps being separated from one another by substantially uniform delays;

a feedback loop feeding back to said phase detection input a signal from one of said signal taps, said feedback loop comprising a feedback multiplexer for selecting said one of said signal taps to feed back; and an output multiplexer for selecting one of said signal taps as an output signal of said phase-locked loop; wherein:

when said output multiplexer selects a first signal tap and said feedback multiplexer selects a subsequent one of said signal taps separated from said first signal tap by an odd number of signal taps, said output signal has a phase that is advanced relative to said input clock signal by an even multiple of said substantially uniform delay;

when said feedback multiplexer selects a first signal tap and said output multiplexer selects a subsequent one of said signal taps separated from said first signal tap by an odd number of signal taps, said output signal has a phase that is retarded relative to said input clock signal by an even multiple of said substantially uniform delay; and said even multiple of said substantially uniform delay is one more than said odd number of signal taps.

2. The phase-locked loop circuit of claim 1 wherein:

said voltage-controlled oscillator is a ring oscillator; and each of said taps is an output of a stage of said ring oscillator.

3. The phase-locked loop circuit of claim 1 further comprising at least one of a programmable pre-scale counter at said input terminal, a programmable post-scale counter downstream of said output multiplexer and a programmable feedback-scale counter downstream of said feedback multiplexer in said feedback loop, wherein:

each of said counters is programmable with an integer value;

said pre-scale counter divides frequency of said output signal by said integer value programmed therein;

said post-scale counter divides frequency of said output signal by said integer value programmed therein; and
said feedback-scale counter multiplies frequency of said output signal by said integer value programmed therein.

4. The phase-locked loop circuit of claim 3 further comprising an output bypass lead for bypassing said post-scale counter.

5. A phase-locked loop circuit comprising:
an input terminal for accepting an input clock signal;
a phase/frequency detector having a signal input connected to said input terminal, a phase detection input and a signal output;
a charge pump having a pump input connected to said signal output of said phase/frequency detector and having a pump output;
a low-pass filter having a filter input connected to said pump output and having a filter output;
a voltage-controlled oscillator having an oscillator input connected to said filter output, an oscillator output which is output of said phase-locked loop, and at least one feedback output;
a feedback loop feeding back to said phase detection input a signal from one of said at least one feedback output; and
a programmable pre-scale counter at said input terminal, a programmable post-scale counter downstream of said oscillator output, an output bypass lead for bypassing said post-scale counter, and a programmable feedback-scale counter in said feedback loop, wherein:
each of said counters is programmable with an integer value;
said pre-scale counter divides frequency of said output signal by said integer value programmed therein;
said post-scale counter divides frequency of said output signal by said integer value programmed therein; and
said feedback-scale counter multiplies frequency of said output signal by said integer value programmed therein.

6. A programmable logic device comprising:
at least one region of clock-signal-utilizing circuitry;
a clock signal input terminal configured to receive a clock signal from circuitry external to the device; and
phase-locked loop circuitry comprising:
a phase/frequency detector having a signal input connected to said clock signal input terminal, a phase detection input and a signal output,
a charge pump having a pump input connected to said signal output of said phase/frequency detector and having a pump output,
a low-pass filter having a filter input connected to said pump output and having a filter output,
a voltage-controlled oscillator having an oscillator input connected to said filter output, an oscillator output, and a plurality of signal taps, said signal taps being separated from one another by substantially uniform delays,
a feedback loop feeding back to said phase detection input a signal from one of said signal taps, said feedback loop comprising a feedback multiplexer for selecting said one of said signal taps to feed back, and
an output multiplexer for selecting one of said signal taps as an output signal of said phase-locked loop, said output multiplexer being coupled to one said at least one region of clock-signal-utilizing circuitry; wherein:

when said output multiplexer selects a first signal tap and said feedback multiplexer selects a subsequent one of said signal taps separated from said first signal tap by an odd number of signal taps, said output signal has a phase that is advanced relative to said input clock signal by an even multiple of said substantially uniform delay;
when said feedback multiplexer selects a first signal tap and said output multiplexer selects a subsequent one of said signal taps separated from said first signal tap by an odd number of signal taps, said output signal has a phase that is retarded relative to said input clock signal by an even multiple of said substantially uniform delay; and
said even multiple of said substantially uniform delay is one more than said odd number of signal taps.

7. The programmable logic device of claim 6 wherein:
said voltage-controlled oscillator is a ring oscillator; and
each of said taps is an output of a stage of said ring oscillator.

8. The programmable logic device of claim 6 further comprising at least one of a programmable pre-scale counter at said input terminal, a programmable post-scale counter downstream of said output multiplexer and a programmable feedback-scale counter downstream of said feedback multiplexer in said feedback loop, wherein:
each of said counters is programmable with an integer value;
said pre-scale counter divides frequency of said output signal by said integer value programmed therein;
said post-scale counter divides frequency of said output signal by said integer value programmed therein; and
said feedback-scale counter multiplies frequency of said output signal by said integer value programmed therein.

9. The programmable logic device of claim 8 further comprising an output bypass lead for bypassing said output counter.

10. A programmable logic device comprising:
at least one region of clock-signal-utilizing circuitry;
a clock signal input terminal configured to receive a clock signal from circuitry external to the device; and
an input terminal for accepting an input clock signal;
a phase/frequency detector having a signal input connected to said input terminal, a phase detection input and a signal output;
a charge pump having a pump input connected to said signal output of said phase/frequency detector and having a pump output;
a low-pass filter having a filter input connected to said pump output and having a filter output;
a voltage-controlled oscillator having an oscillator input connected to said filter output, an oscillator output which is output of said phase-locked loop, and at least one feedback output;
a feedback loop feeding back to said phase detection input a signal from one of said at least one feedback output; and
a programmable pre-scale counter at said input terminal, a programmable post-scale counter downstream of said oscillator output and a programmable feedback-scale counter in said feedback loop, wherein:
said oscillator output is coupled to one said at least one region of clock-signal-utilizing circuitry;

each of said counters is programmable with an integer value;

said pre-scale counter divides frequency of said output signal by said integer value programmed therein;

said post-scale counter divides frequency of said output signal by said integer value programmed therein; and said feedback-scale counter multiplies frequency of said output signal by said integer value programmed therein.

11. The programmable logic device of claim 10 further comprising an output bypass lead for bypassing said post-scale counter.

12. A digital processing system comprising:

processing circuitry;

a memory coupled to said processing circuitry; and a programmable logic device, comprising a phase-locked loop circuit as defined in claim 1, coupled to the processing circuitry and the memory.

13. A digital processing system comprising:

processing circuitry;

a memory coupled to said processing circuitry; and a programmable logic device as defined in claim 10, coupled to the processing circuitry and the memory.

14. A printed circuit board on which is mounted a programmable logic device comprising a phase-locked loop circuit as defined in claim 1.

15. The printed circuit board defined in claim 14 further comprising:

a memory mounted on the printed circuit board and coupled to the memory circuitry.

16. The printed circuit board defined in claim 14 further comprising:

processing circuitry mounted on the printed circuit board and coupled to the memory circuitry.

17. A printed circuit board on which is mounted a programmable logic device as defined in claim 10.

18. The printed circuit board defined in claim 17 further comprising:

a memory mounted on the printed circuit board and coupled to the memory circuitry.

19. The printed circuit board defined in claim 17 further comprising:

processing circuitry mounted on the printed circuit board and coupled to the memory circuitry.

20. A digital processing system comprising:

processing circuitry;

a memory coupled to said processing circuitry; and a programmable logic device as defined in claim 7 coupled to the processing circuitry and the memory.

21. A printed circuit board on which is mounted a programmable logic device as defined in claim 6.

22. The printed circuit board defined in claim 21 further comprising:

a memory mounted on the printed circuit board and coupled to the memory circuitry.

23. The printed circuit board defined in claim 21 further comprising:

processing circuitry mounted on the printed circuit board and coupled to the memory circuitry.

24. A phase-locked loop circuit comprising:

an input terminal for accepting an input clock signal;

a phase/frequency detector having a signal input connected to said input terminal, a phase detection input and a signal output;

a charge pump having a pump input connected to said signal output of said phase/frequency detector and having a pump output;

a low-pass filter having a filter input connected to said pump output and having a filter output;

a voltage-controlled oscillator having an oscillator input connected to said filter output, an oscillator output, and a plurality of signal taps, said signal taps being separated from one another by substantially uniform delays;

a feedback loop feeding back to said phase detection input a signal from one of said signal taps, said feedback loop comprising a feedback multiplexer for selecting said one of said signal taps to feed back; and an output multiplexer for selecting one of said signal taps as an output signal of said phase-locked loop; wherein:

when said output multiplexer selects a first signal tap and said feedback multiplexer selects a subsequent one of said signal taps separated from said first signal tap by a selected number of signal taps, said selected number being at least two, said output signal has a phase that is advanced relative to said input clock signal by a multiple of said substantially uniform delay;

when said feedback multiplexer selects a first signal tap and said output multiplexer selects a subsequent one of said signal taps separated from said first signal tap by a selected number of signal taps, said selected number being at least two, said output signal has a phase that is retarded relative to said input clock signal by a multiple of said substantially uniform delay; and said multiple of said substantially uniform delay is one more than said selected number of signal taps.

25. The phase-locked loop circuit of claim 24 wherein:

said voltage-controlled oscillator is a ring oscillator; and each of said taps is an output of a stage of said ring oscillator.

26. The phase-locked loop circuit of claim 24 further comprising at least one of a programmable pre-scale counter at said input terminal, a programmable post-scale counter downstream of said output multiplexer and a programmable feedback-scale counter downstream of said feedback multiplexer in said feedback loop, wherein:

each of said counters is programmable with an integer value;

said pre-scale counter divides frequency of said output signal by said integer value programmed therein;

said post-scale counter divides frequency of said output signal by said integer value programmed therein; and said feedback-scale counter multiplies frequency of said output signal by said integer value programmed therein.

27. The phase-locked loop circuit of claim 26 further comprising an output bypass lead for bypassing said post-scale counter.

28. A programmable logic device comprising:

at least one region of clock-signal-utilizing circuitry;

a clock signal input terminal configured to receive a clock signal from circuitry external to the device; and phase-locked loop circuitry comprising:

a phase/frequency detector having a signal input connected to said clock signal input terminal, a phase detection input and a signal output, a charge pump having a pump input connected to said signal output of said phase/frequency detector and having a pump output, a low-pass filter having a filter input connected to said pump output and having a filter output, a voltage-controlled oscillator having an oscillator input connected to said filter output, an oscillator output, and a plurality of signal taps, said signal taps being separated from one another by substantially uniform delays, a feedback loop feeding back to said phase detection input a signal from one of said signal taps, said feedback loop comprising a feedback multiplexer for selecting said one of said signal taps to feed back, and an output multiplexer for selecting one of said signal taps as an output signal of said phase-locked loop, said output multiplexer being coupled to one said at least one region of clock-signal-utilizing circuitry; wherein:

when said output multiplexer selects a first signal tap and said feedback multiplexer selects a subsequent one of said signal taps separated from said first signal tap by a selected number of signal taps, said selected number being at least two, said output signal has a phase that is advanced relative to said input clock signal by a first multiple of said substantially uniform delay;

when said feedback multiplexer selects a first signal tap and said output multiplexer selects a subsequent one of said signal taps separated from said first signal tap by a selected number of signal taps, said selected number being at least two, said output signal has a phase that is retarded relative to said input clock signal by a multiple of said substantially uniform delay; and said multiple of said substantially uniform delay is one more than said selected number of signal taps.

29. The programmable logic device of claim 28 wherein:

said voltage-controlled oscillator is a ring oscillator; and each of said taps is an output of a stage of said ring oscillator.

30. The programmable logic device of claim 28 further comprising at least one of a programmable pre-scale counter at said input terminal, a programmable post-scale counter downstream of said output multiplexer and a programmable feedback-scale counter downstream of said feedback multiplexer in said feedback loop, wherein:

each of said counters is programmable with an integer value;

said pre-scale counter divides frequency of said output signal by said integer value programmed therein;

said post-scale counter divides frequency of said output signal by said integer value programmed therein; and said feedback-scale counter multiplies frequency of said output signal by said integer value programmed therein.

31. The programmable logic device of claim 30 further comprising an output bypass lead for bypassing said output counter.

32. A digital processing system comprising:

processing circuitry;

a memory coupled to said processing circuitry; and a programmable logic device comprising a phase-locked loop circuit as defined in claim 24 coupled to the processing circuitry and the memory.

33. A digital processing system comprising:

processing circuitry;

a memory coupled to said processing circuitry; and a programmable logic device as defined in claim 28 coupled to the processing circuitry and the memory.

34. A printed circuit board on which is mounted a programmable logic device comprising a phase-locked loop circuit as defined in claim 24.

35. The printed circuit board defined in claim 34 further comprising:

a memory mounted on the printed circuit board and coupled to the memory circuitry.

36. The printed circuit board defined in claim 34 further comprising:

processing circuitry mounted on the printed circuit board and coupled to the memory circuitry.

37. A printed circuit board on which is mounted a programmable logic device as defined in claim 28.

38. The printed circuit board defined in claim 37 further comprising:

a memory mounted on the printed circuit board and coupled to the memory circuitry.

39. The printed circuit board defined in claim 37 further comprising:

processing circuitry mounted on the printed circuit board and coupled to the memory circuitry.

* * * * *

UNITED STATES PATENT AND TRADEMARK OFFICE
CERTIFICATE OF CORRECTION

PATENT NO. : 6,483,886 B1　　　　　　　　　　　　　　　　　　　　　　　　Page 1 of 1
DATED : November 19, 2002
INVENTOR(S) : Chiakang Sung et al.

It is certified that error appears in the above-identified patent and that said Letters Patent is hereby corrected as shown below:

Drawings,
FIG. 2, the left-hand occurrence of "202" should be -- 212 --.
FIG. 2, the left-hand occurrence of "203" should be -- 213 --.
FIG. 2, the left-hand occurrence of "204" should be -- 214 --.
FIG. 2, the left-hand occurrence of "205" should be -- 215 --.

Column 7,
Line 23, "301" should be -- 302 --.

Column 11,
Lines 31, 35, 42, 46, 58 and 62, "memory circuitry." should be -- programmable logic device. --.

Column 14,
Lines 31, 35, 41 and 45, "memory circuitry." should be -- programmable logic device. --.

Signed and Sealed this

Eighteenth Day of March, 2003

JAMES E. ROGAN
*Director of the United States Patent and Trademark Office*